US009324435B2

(12) United States Patent
Chu

(10) Patent No.: US 9,324,435 B2
(45) Date of Patent: Apr. 26, 2016

(54) DATA TRANSMITTING METHOD, MEMORY CONTROL CIRCUIT UNIT AND MEMORY STORAGE APPARATUS

(71) Applicant: PHISON ELECTRONICS CORP., Miaoli (TW)

(72) Inventor: Chien-Hua Chu, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 88 days.

(21) Appl. No.: 14/258,037

(22) Filed: Apr. 22, 2014

(65) Prior Publication Data

US 2015/0235706 A1 Aug. 20, 2015

(30) Foreign Application Priority Data

Feb. 20, 2014 (TW) .............................. 103105718 A

(51) Int. Cl.
G11C 16/10 (2006.01)
G11C 7/04 (2006.01)
G11C 16/26 (2006.01)

(52) U.S. Cl.
CPC ........ *G11C 16/10* (2013.01); *G11C 7/04* (2013.01); *G11C 16/26* (2013.01)

(58) Field of Classification Search
CPC ........... G11C 16/10; G11C 16/26; G11C 7/04
USPC ............... 365/185.24, 211; 711/103, 118
See application file for complete search history.

(56) References Cited

U.S. PATENT DOCUMENTS

| | | | | |
|---|---|---|---|---|
| 6,233,190 B1* | 5/2001 | Cooper | .................... | G11C 7/04 365/211 |
| 8,473,680 B1* | 6/2013 | Pruthi | ................. | G06F 12/0888 711/118 |
| 2007/0255892 A1* | 11/2007 | Jachalsky | ............... | G11C 16/10 711/103 |
| 2010/0023678 A1* | 1/2010 | Nakanishi | ............... | G06F 1/206 711/103 |
| 2010/0131806 A1* | 5/2010 | Weingarten | ......... | G06F 11/1072 714/54 |
| 2012/0066439 A1* | 3/2012 | Fillingim | ............ | G06F 11/3485 711/103 |
| 2013/0135926 A1* | 5/2013 | Roohparvar | ........... | G11C 16/10 365/185.03 |
| 2013/0159607 A1* | 6/2013 | Kyung | ................... | G11C 16/10 711/103 |
| 2014/0126292 A1* | 5/2014 | Yang | ........................ | G11C 7/04 365/185.18 |
| 2015/0029796 A1* | 1/2015 | Choi | ................. | G11C 11/5642 365/189.05 |

* cited by examiner

*Primary Examiner* — Vu Le
*Assistant Examiner* — Sung Cho
(74) *Attorney, Agent, or Firm* — Jianq Chyun IP Office

(57) ABSTRACT

A data transmitting method for a memory storage apparatus is provided. The method includes: initially setting a first threshold and a first accumulated value; and updating the first threshold by using the first threshold plus the first accumulated value at intervals of a first predetermined time. The method also includes when a detected temperature of the memory storage apparatus is greater than or equal to a temperature threshold, determining whether a size of received writing data is greater than or equal to the first threshold; and if no, writing the writing data into a rewritable non-volatile memory module and then updating the first threshold by using the first threshold minus the size of the writing data; and if yes, not writing the writing data into the rewritable non-volatile memory module. Accordingly, the method can effectively prevent overheat of system during operations of the memory storage apparatus.

18 Claims, 8 Drawing Sheets

DATA TRANSMITTING METHOD, MEMORY CONTROL CIRCUIT UNIT AND MEMORY STORAGE APPARATUS

CROSS-REFERENCE TO RELATED APPLICATION

This application claims the priority benefit of Taiwan application serial no. 103105718, filed on Feb. 20, 2014. The entirety of the above-mentioned patent application is hereby incorporated by reference herein and made a part of this specification.

BACKGROUND

1. Technical Field

The present invention relates to a data transmitting method, and more particularly, to a data transmitting method for a memory storage apparatus having a rewritable non-volatile memory module, and a memory control circuit unit and a memory storage apparatus using the method.

2. Description of Related Art

The growth of digital cameras, mobile phones, and MP3 players has been rapid in recent years. Consequently, the consumers' demand for storage media has increased tremendously. In recent years, a rewritable non-volatile memory has become an import part of the electronic industries because the rewritable non-volatile memory is capable of providing features such as data non-volatility, low power consumption, small volume, non-mechanical structure and high read/write speed. For instance, a solid-state drive utilizing a flash memory as a storage media has been widely applied in a computer host as a main hard disk for enhancing access efficiency of computer.

In addition, when a memory storage apparatus having the rewritable non-volatile memory is operated in high speed (e.g., writing and reading a great amount of data), a great amount of energy is consumed to generate a great amount of heat, thus the memory storage apparatus is prone to overheat which lowers its access efficiency or causes damages thereto. Accordingly, under a principle in which access performance and execution performance are both considered, in order to prevent overheat of system during operations of the memory storage apparatus, it is an important issue to maintain a balance between heat generation and heat dissipation for the memory storage apparatus while operating performances of computer systems are continuously improved.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention is directed to a data transmitting method, a memory control circuit unit, and a memory storage apparatus, capable of effectively prevent overheat of the system during operations of the memory storage apparatus, so as to make heat generation and heat dissipation of the memory storage apparatus reaching a stable status.

A data transmitting method for a memory storage apparatus having a rewritable non-volatile memory module is proposed according to an exemplary embodiment of the invention, and the data transmitting method includes: (a) initially setting a first threshold and a first accumulated value; (b) updating the first threshold by using the first threshold plus the first accumulated value at intervals of a first predetermined time; (c) receiving a writing data; (d) detecting a temperature of the memory storage apparatus; (e) determining whether the temperature of the memory storage apparatus is greater than or equal to a temperature threshold, wherein step (f) is executed if the temperature of the memory storage apparatus is not greater than or equal to the temperature threshold, and step (g) is executed if the temperature of the memory storage apparatus is greater than or equal to the temperature threshold; (f) writing the writing data into the rewritable non-volatile memory module; (g) determining whether a size of the writing data is greater than or equal to the first threshold, wherein step (h) is executed if the size of the writing data is not greater than or equal to the first threshold, and step (i) is executed if the size of the writing data is greater than or equal to the first threshold; (h) writing the writing data into the rewritable non-volatile memory module, and updating the first threshold by using the first threshold minus the size of the writing data; and (i) not writing the writing data into the rewritable non-volatile memory module, and re-executing the step (g) after the first predetermined time.

A memory control circuit unit for controlling a rewritable non-volatile memory module of a memory storage apparatus is provided according to an exemplary embodiment of the invention, and the memory control circuit unit includes: a host interface configured to couple to a host system; a memory interface configured to couple to the rewritable non-volatile memory module; and a memory management circuit coupled to the host interface and the memory interface. The memory management circuit initially sets a first threshold and a first accumulated value, and updates the first threshold by using the first threshold plus the first accumulated value at intervals of a first predetermined time. The memory management circuit is further configured to receive a writing data. The memory management circuit is further configured to detect the temperature of the memory storage apparatus and determine whether the temperature of the memory storage apparatus is greater than or equal to the temperature threshold. If the temperature of the memory storage apparatus is not greater than or equal to the temperature threshold, the memory management circuit sends a first command sequence, and the first command sequence is configured to instruct for executing a data writing operation to write the writing data into the rewritable non-volatile memory module. If the temperature of the memory storage apparatus is greater than or equal to the temperature threshold, the memory management circuit is further configured to execute a first data quantity determining operation to determine whether a size of the writing data is greater than or equal to the first threshold. If the size of the writing data is not greater than or equal to the first threshold, the memory management circuit sends the first command sequence, and the first command sequence is configured to instruct for executing the data writing operation to write the writing data into the rewritable non-volatile memory module and the memory management circuit updates the first threshold by using the first threshold minus the size of the writing data. If the size of the writing data is greater than or equal to the first threshold, the memory management circuit executes a pause writing operation to not write the writing data into the rewritable non-volatile memory module and re-execute the first data quantity determining operation after the first predetermined time.

A memory storage apparatus is provided according to an exemplary embodiment of the invention, which includes: a connector configured to connect to a host system; a rewritable non-volatile memory module; and a memory control circuit unit. The memory control circuit unit is coupled to the connector and the rewritable non-volatile memory module, and configured to initially set a first threshold and a first accumulated value, and update the first threshold by using the first threshold plus the first accumulated value at intervals of a first predetermined time. The memory control circuit unit is further configured to receive a writing data, and detect the temperature of the memory storage apparatus and determine whether the temperature of the memory storage apparatus is greater than or equal to the temperature threshold. If the temperature of the memory storage apparatus is not greater than or equal to the temperature threshold, the memory control circuit unit sends a first command sequence, and the first command sequence is configured to instruct for executing a data writing operation to write the writing data into the rewritable non-volatile memory module. If the temperature of the memory storage apparatus is greater than or equal to the temperature threshold, the memory control circuit unit executes a first data quantity determining operation to determine whether a size of the writing data is greater than or equal to the first threshold. If the size of the writing data is not greater than or equal to the first threshold, the memory control circuit unit sends the first command sequence, and the first command sequence is configured to instruct for executing the data writing operation to write the writing data into the rewritable non-volatile memory module and the memory control circuit unit updates the first threshold by using the first threshold minus the size of the writing data. If the size of the writing data is greater than or equal to the first threshold, the memory control circuit unit executes a pause writing operation to not write the writing data into the rewritable non-volatile memory module and re-execute the first data quantity determining operation after the first predetermined time.

Based on above, according to the data transmitting method, the memory control circuit unit and the memory storage apparatus, when the temperature of the memory storage apparatus is increased to reach the threshold, a speed for accessing data may be effectively controlled to reduce power consumption, so as to prevent overheat of system during operations of the memory storage apparatus in constantly accessing a great amount of data.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
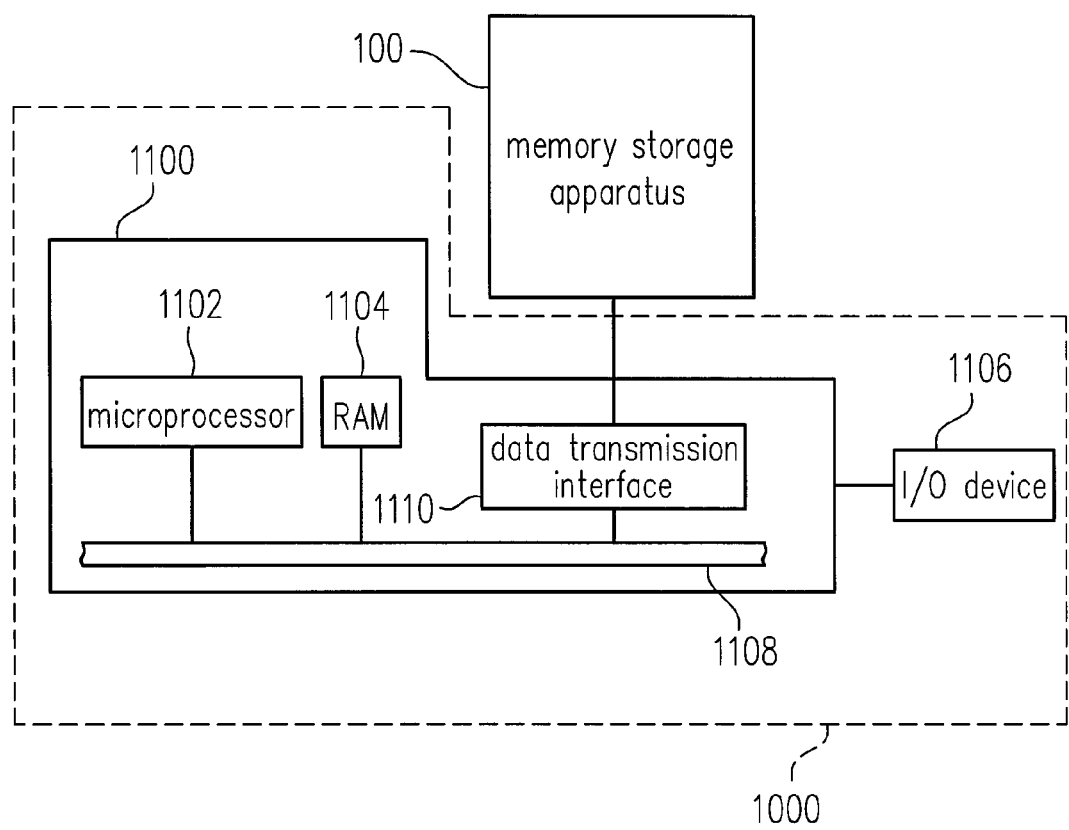
FIG. 1A is a schematic diagram of a host system and a memory storage apparatus according to first exemplary embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

First Exemplary Embodiment

Generally, a memory storage apparatus (also known as a memory storage system) includes a rewritable non-volatile memory module and a controller (also known as a control circuit). The memory storage apparatus is usually configured together with a host system so that the host system may write data to or read data from the memory storage apparatus.

FIG. 1A is a schematic diagram of a host system and a memory storage apparatus according to first exemplary embodiment of the invention.

Figure 1B:
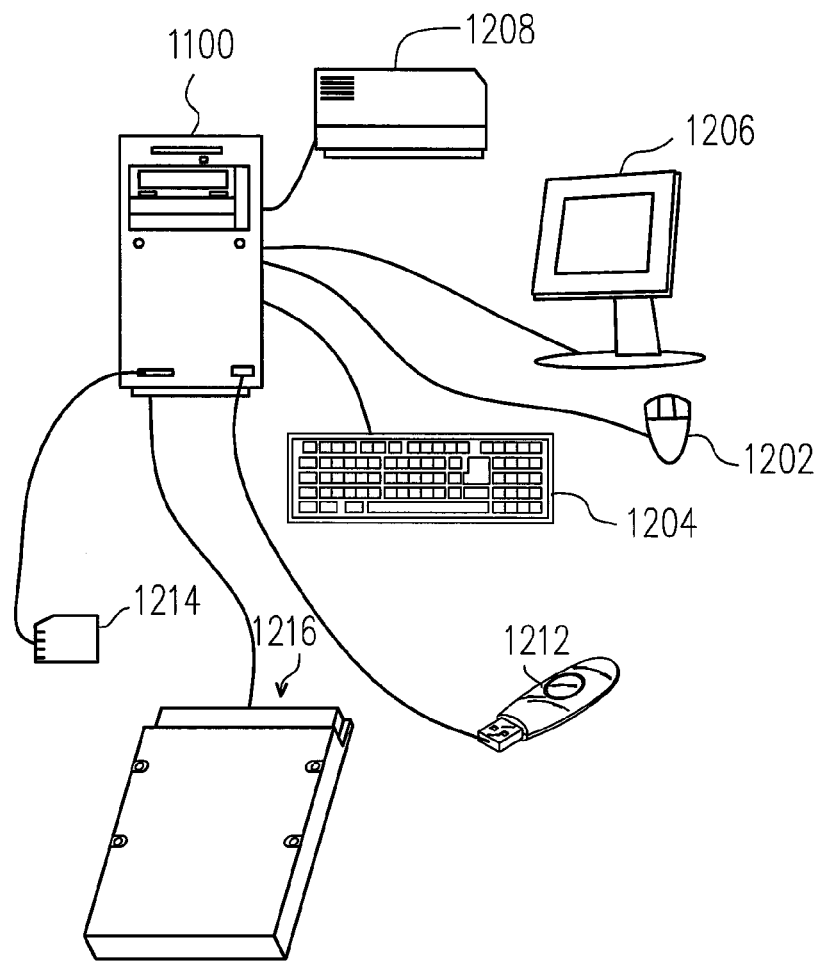
FIG. 1B is a schematic diagram of a computer, an input/output device, and a memory storage apparatus according to an exemplary embodiment of the present invention.

Referring to FIG. 1A, a host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206 and a printer 1208 as shown in FIG. 1B. It should be understood that the devices illustrated in FIG. 1B are not intended to limit the I/O device 1106, and the I/O device 1106 may further include other devices.

In the present embodiment of the invention, the memory storage apparatus 100 is electrically connected to other devices of the host system 1000 through the data transmission interface 1110. By using the microprocessor 1102, the random access memory 1104 and the Input/Output (I/O) device 1106, data may be written into the memory storage apparatus 100 or may be read from the memory storage apparatus 100. For example, the memory storage apparatus 100 may be a rewritable non-volatile memory storage apparatus such as a flash drive 1212, a memory card 1214, or a solid state drive (SSD) 1216 as shown in FIG. 1B.

Figure 1C:
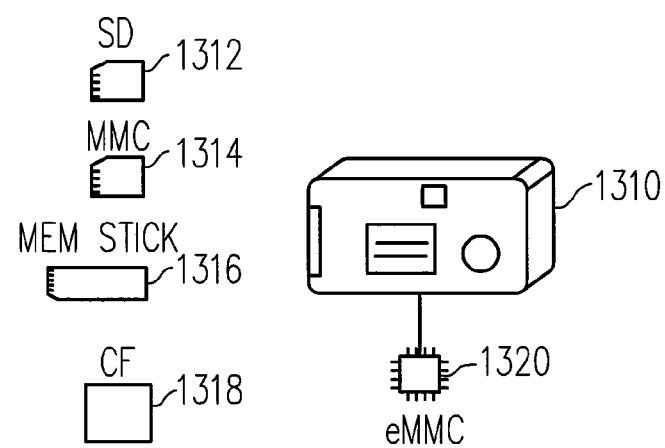
FIG. 1C is a schematic diagram of a host system and a memory storage apparatus according to embodiments of the present invention.

Generally, the host system 1000 may substantially be any system capable of storing data with the memory storage apparatus 100. Although the host system 1000 is described by using a computer system for example in the present exemplary embodiment, in another exemplary embodiment of the invention, the host system 1000 may be a digital camera, a video camera, a telecommunication device, an audio player, or a video player. For example, if the host system is a digital camera (video camera) 1310 depicted in FIG. 1C, the rewritable non-volatile memory storage apparatus may be a SD card 1312, a MMC card 1314, a memory stick 1316, a CF card 1318 or an embedded storage device 1320 (as shown in FIG. 1C). The embedded storage device 1320 includes an embedded MMC (eMMC). It should be mentioned that the eMMC is electrically connected to a substrate of the host system, directly.

Figure 2:
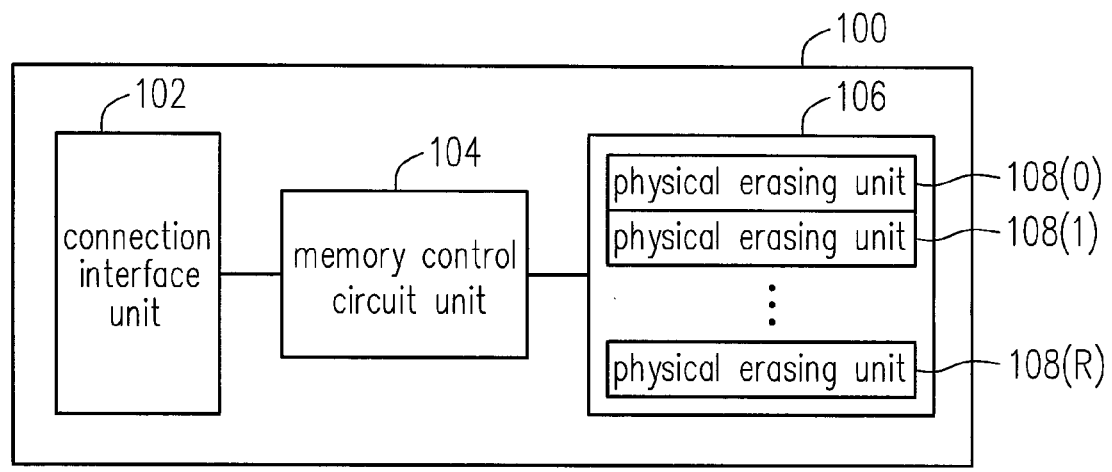
FIG. 2 is a schematic block diagram illustrating the memory storage apparatus depicted in FIG. 1A.

FIG. 2 is a schematic block diagram illustrating the memory storage apparatus depicted in FIG. 1A.

Referring to FIG. 2, the memory storage apparatus 100 includes a connection interface unit 102, a memory control circuit unit 104 and a rewritable non-volatile memory storage module 106.

In the present exemplary embodiment, the connection interface unit 102 is compatible with a serial advanced technology attachment (SATA) standard. However, the invention is not limited thereto, and the connection interface unit 102 may also be compatible to Parallel Advanced Technology Attachment (PATA) standard, Institute of Electrical and Electronic Engineers (IEEE) 1394 standard, Peripheral Component Interconnect (PCI) Express interface standard, Universal Serial Bus (USB) standard, Ultra High Speed-I (UHS-I) interface standard, Ultra High Speed-II (UHS-II) interface standard, Secure Digital (SD) interface standard, Memory Stick (MS) interface standard, Multi Media Card (MMC) interface standard, Compact Flash (CF) interface standard, Integrated Device Electronics (IDE) interface standard or other suitable standards. In the present exemplary embodiment, the connection interface unit and the memory control circuit unit may be packaged into one chip, or distributed outside of a chip containing the memory control circuit unit.

The memory control circuit unit 104 is configured to execute a plurality of logic gates or control commands which are implemented in a hardware form or in a firmware form, so as to perform operations of writing, reading, erasing and merging data in the rewritable non-volatile memory storage module 106 according to the commands of the host system 1000.

The rewritable non-volatile memory storage module 106 is coupled to the memory control circuit unit 104 and configured to store data written from the host system 1000. The rewritable non-volatile memory storage module 106 has multiple physical erasing units 108(0) to 108(R). For example, the physical erasing units 108(0) to 108(R) may belong to the same memory die or belong to different memory dies. Each physical erasing unit has a plurality of physical programming units, and the physical programming units of the same physical erasing unit may be written separately and erased simultaneously. Additionally, each physical erasing unit is composed by 64 physical programming units, 256 physical programming units or any amount of the physical programming units.

More specifically, the physical erasing unit is the minimum unit for erasing. Namely, each physical erasing unit contains the least number of memory cells to be erased together. The physical programming unit is the minimum unit for programming. That is, the physical programming unit is the minimum unit for writing data. Each physical programming unit usually includes a data bit area and a redundancy bit area. The data bit area having multiple physical access addresses is used to store user data, and the redundant bit area is used to store system data (e.g., control information and error checking and correcting code). In the present exemplary embodiment, each data bit area of the physical programming unit contains 4 physical access addresses, and the size of each physical access address is 512 bytes. However, in other exemplary embodiments, more or less number of the physical address may be contained in the data bit area, amount and size of the physical access address are not limited in the invention. For example, in an exemplary embodiment, the physical erasing unit is a physical block, and the physical programming unit is a physical page or a physical sector, but the invention is not limited thereto.

In the present exemplary embodiment, the rewritable non-volatile memory module 106 is a Multi Level Cell (MLC) NAND flash memory module (i.e., a flash memory module capable of storing two bits of data in one memory cell). However, the invention is not limited thereto. The rewritable non-volatile memory module 106 may also be a Single Level Cell (SLC) NAND flash memory module, (i.e., a flash memory module capable of storing one bit of data in one memory cell), a Trinary Level Cell (TLC) NAND flash memory module (i.e., a flash memory module capable of storing three bits of data in one memory cell), other flash memory modules or any memory module having the same features.

Figure 3:
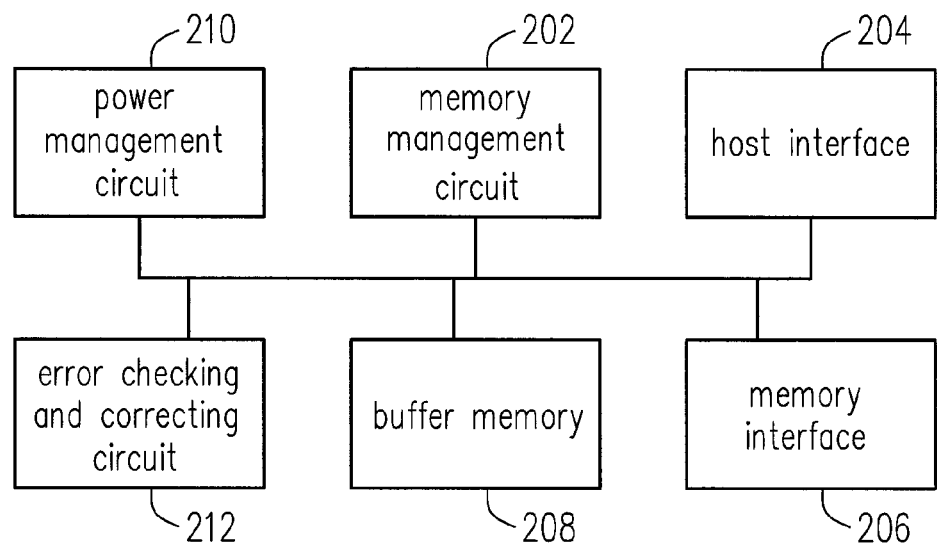
FIG. 3 is a schematic block diagram illustrating a memory control circuit unit according to first exemplary embodiment of the present invention.

FIG. 3 is a schematic block diagram illustrating a memory control circuit unit according to first exemplary embodiment of the invention.

Referring to FIG. 3, the memory control circuit unit 104 includes a memory management circuit 202, a host interface 204 and a memory interface 206.

The memory management circuit 202 is configured to control overall operations of the memory control circuit unit 104. Specifically, the memory management circuit 202 has a plurality of control commands. When the memory storage apparatus 100 operates, the control commands are executed to perform various operations such as data writing, data reading and data erasing.

In the present exemplary embodiment, the control commands of the memory management circuit 202 are implemented in a form of a firmware. For instance, the memory management circuit 202 has a microprocessor unit (not illustrated) and a ROM (not illustrated), and the control commands are burned into the ROM. When the memory storage apparatus 100 operates, the control commands are executed by the microprocessor to perform operations of writing, reading or erasing data.

In another exemplary embodiment of the invention, the control commands of the memory management circuit 202 may also be stored as program codes in a specific area (for example, the system area in a memory exclusively used for storing system data) of the rewritable non-volatile memory module 106. In addition, the memory management circuit 202 has a microprocessor unit (not illustrated), a ROM (not illustrated) and a RAM (not illustrated). Particularly, the ROM has an activate code, which is executed by the microprocessor unit to load the control commands stored in the rewritable non-volatile memory module 106 to the RAM of the memory management circuit 202 when the memory control circuit unit 104 is enabled. Next, the control commands are executed by the microprocessor unit to perform operations of writing, reading or erasing data.

The host interface 204 is coupled to the memory management circuit 202 and configured to couple to the connection interface unit 102, so as to receive and identify commands and data sent from the host system 1000. Namely, the commands and data sent from the host system 1000 are passed to the memory management circuit 202 through the host interface 204. In the present exemplary embodiment, the host interface 204 is compatible to a SATA standard. However, it should be understood that the present invention is not limited thereto, and the host interface 204 may also be compatible with a PATA standard, an IEEE 1394 standard, a PCI Express standard, a USB standard, a UHS-I standard, a UHS-II standard, a SD standard, a MS standard, a MMC standard, a CF standard, an IDE standard, or other suitable standards for data transmission.

The memory interface 206 is coupled to the memory management circuit 202 and configured to access the rewritable non-volatile memory module 106. That is, data to be written to the rewritable non-volatile memory module 106 is converted to a format acceptable to the rewritable non-volatile memory module 106 through the memory interface 206.

In an exemplary embodiment of the invention, the memory control circuit unit 104 further includes a buffer memory 208, a power management circuit 210 and an error checking and correcting circuit 212.

The buffer memory 208 is coupled to the memory management circuit 202 and configured to temporarily store data and commands from the host system 1000 or data from the rewritable non-volatile memory module 106.

The power management unit 210 is coupled to the memory management circuit 202 and configured to control a power of the memory storage apparatus 100.

The error checking and correcting circuit 212 is coupled to the memory management circuit 202 and configured to perform an error checking and correcting process to ensure the correctness of data. Specifically, when the memory management circuit 202 receives a write command from the host system 1000, the error checking and correcting circuit 212 generates an error checking and correcting code (ECC code) for data corresponding to the write command, and the memory management circuit 202 writes data and the ECC code corresponding to the write command to the rewritable non-volatile memory module 106. Next, when reading data from the rewritable non-volatile memory module 106, the memory management circuit 202 also reads the ECC Code corresponding to such data, and the error checking and correcting circuit 212 performs an error checking and correcting process on the read data based on the read ECC code.

Referring back to FIG. 2, the memory control circuit unit 104 (or the memory management circuit 202) initially sets a first threshold and a first accumulated value, and updates the first threshold by using the first threshold plus the first accumulated value at intervals of a predetermined time (e.g., 1 ms). Particularly, when the data to be written into the rewritable non-volatile memory module 106 that is transmitted by the host system 1000 is received, the memory control circuit unit 104 (or the memory management circuit 202) detects a temperature of the memory storage apparatus 100 and determines whether the temperature of the memory storage apparatus 100 is greater than or equal to a temperature threshold. If the temperature of the memory storage apparatus 100 is not greater than or equal to the temperature threshold, the memory control circuit unit 104 (or the memory management circuit 202) sends a command sequence, and the command sequence is configured to instruct for writing a writing data into the rewritable non-volatile memory module Particularly, the command sequence may include one or more commands. On the contrary, if the temperature of the memory storage apparatus 100 is greater than or equal to the temperature threshold, the memory control circuit unit 104 (or the memory management circuit 202) executes a first data quantity determining operation to determine whether a size of the writing data is greater than or equal to the first threshold being set. If the size of the writing data is not greater than or equal to the first threshold, the memory control circuit unit 104 (or the memory management circuit 202) sends a command sequence, and the command sequence is configured to instruct for executing a data writing operation to write the writing data into the rewritable non-volatile memory module 106 and update the first threshold by using the first threshold minus the size of the writing data. On the contrary, if the size of the writing data is greater than or equal to the first threshold, the memory control circuit unit 104 (or the memory management circuit 202) executes a pause writing operation to not write the writing data into the rewritable non-volatile memory module 106 and re-execute said operation for determining whether the size of the writing data is greater than or equal to the first threshold after a first predetermined time (e.g., 1 ms).

More specifically, by using aforesaid data transmitting method, power consumption may be reduced by limiting a data transmission speed. For instance, if it is intended to limit the data transmission speed at 100 MB/s (which is equivalent to transmit 200 sector data of 512 byte per 1 ms), and assuming that the memory control circuit unit 104 (or the memory management circuit 202) initially sets the first threshold to 300 and sets the first accumulated value to 200, and the memory control circuit unit 104 (or the memory management circuit 202) updates the first threshold by using the first threshold plus the first accumulated value at intervals of 1 ms. Accordingly, when the data to be written into the rewritable non-volatile memory module 106 is 200 sector data, the memory control circuit unit 104 (or the memory management circuit 202) may then determine that the size (the 200 sector data) of the writing data is not greater than or equal to the first threshold (300), write the 200 sector data into the rewritable non-volatile memory module 106, and update the first threshold by using the first threshold minus the size of the writing data. In this case, the updated first threshold is 100. In case the first threshold becomes 300 (i.e., the first threshold plus the first accumulated value) after 1 ms while the writing data received by the memory control circuit unit 104 (or the memory management circuit 202) is 500 sector data, the memory control circuit unit 104 (or the memory management circuit 202) may determine that the size of the writing data (the 500 sector data) is greater than or equal to the current first threshold (300), and therefore execute the pause writing operation to not write the writing data into the rewritable non-volatile memory module 106 and re-determine whether the size of the writing data is greater than or equal to the first threshold after 1 ms. The memory control circuit unit 104 (or the memory management circuit 202) updates the first threshold by using the first plus the first accumulated value at intervals of 1 ms, the updated first threshold already becomes 500 when re-determining whether the size of the writing data is greater than or equal to the first threshold. In this case, the memory control circuit unit 104 (or the memory management circuit 202) determines that the size (the 500 sector data) is greater than or equal to the current first threshold (500), and therefore execute the pause writing operation to not write the writing data into the rewritable non-volatile memory module 106 and re-determine whether the size of the writing data is greater than or equal to the first threshold after 1 ms. Because the memory control circuit unit 104 (or the memory management circuit 202) updates the first threshold by using the first plus the first accumulated value at intervals of 1 ms, the updated first threshold already becomes 700 when re-determining whether the size of the writing data is greater than or equal to the first threshold. In this case, the memory control circuit unit 104 (or the memory management circuit 202) determines that the size (the 500 sector data) is not greater than or equal to the current first threshold (700), and therefore writes the writing data into the rewritable non-volatile memory module 106 and updates the first threshold according to aforesaid steps. As a result, a data writing speed is controlled to maintain at 100 MB/s.

It should be noted that, power consumption required in the data writing operation for the rewritable non-volatile memory module 106 is different from power consumption required in a data reading operation. Particularly, when the data reading operation is executed, a number of output/input actions is relatively more than that in the data writing operation, thus an increasing speed of the temperature of the memory storage apparatus 100 is relatively faster in comparison with the data writing operation. Therefore, in an exemplary embodiment, in order to make heat generation and heat dissipation reaching a stable status, the data transmission speed may be further limited by setting different thresholds and accumulated values for the data writing operation and the data reading operation, respectively.

The memory control circuit unit 104 (or the memory management circuit 202) may initially set a second threshold and a second accumulated value for the data reading operation, and updates the second threshold by using the second threshold plus the second accumulated value at intervals of a second predetermined time (e.g., 1 ms). When the memory control circuit unit 104 (or the memory management circuit 202) receives a read command from the host system that is intended to read the data from the rewritable non-volatile memory module 106, the memory control circuit unit 104 (or the memory management circuit 202) detects the temperature of the memory storage apparatus 100 and determines whether the temperature of the memory storage apparatus 100 is greater than or equal to the temperature threshold. If the temperature of the memory storage apparatus 100 is not greater than or equal to the temperature threshold, the memory control circuit unit 104 (or the memory management circuit 202) sends a command sequence, and the command sequence is configured to instruct for reading a reading data corresponding to the read command from the rewritable non-volatile memory module. On the contrary, if the temperature of the memory storage apparatus 100 is greater than or equal to the temperature threshold, the memory control circuit unit 104 (or the memory management circuit 202) executes a second data quantity determining operation to determine whether a size of the reading data to be read from the rewritable non-volatile memory module 106 is greater than or equal to the second threshold. If the size of the reading data is not greater than or equal to the second threshold, the memory control circuit unit 104 (or the memory management circuit 202) sends a command sequence, and the command sequence is configured to instruct for executing the data reading operation to read the reading data corresponding to the read command from the rewritable non-volatile memory module 106 and update the second threshold by using the second threshold minus the size of the reading data. On the contrary, if the size of the reading data is greater than or equal to the second threshold, the memory control circuit unit 104 (or the memory management circuit 202) executes a pause reading operation to not read the reading data from the rewritable non-volatile memory module 106 and re-execute the second data quantity determining operation for determining whether the size of the reading data is greater than or equal to the second threshold after a second predetermined time (e.g., 1 ms).

More specifically, because power consumption required in the data reading operation is greater than power consumption required in the data writing operation, the second threshold and the second accumulated value may be set to values less than the first threshold and the first accumulated value, respectively. For instance, the second threshold may be set to 200 when the first threshold is set to 300, and the second accumulated value may be set to 100 when the first accumulated value is set to 200.

It should be noted that, when a memory storage apparatus 100 is operated in high speed (e.g., constantly writing and reading a great amount of data), a great amount of energy is consumed to generate a great amount of heat, thus the memory storage apparatus 100 is prone to overheat. In the present exemplary embodiment, the memory control circuit unit 104 (or the memory management circuit 202) is further configured to detect the temperature of the memory storage apparatus 100 and determine whether the temperature of the memory storage apparatus 100 is greater than or equal to the temperature threshold. The first data quantity determining operation or the second data quantity determining operation are only executed when the memory control circuit unit 104 (or the memory management circuit 202) determines that the temperature of the memory storage apparatus 100 is greater than or equal to the temperature threshold (i.e., the memory storage apparatus 100 is overheating). And, the data writing operation or the pause writing operation are executed according to the first data quantity determining operation, and the data reading operation or the pause reading operation are executed according to the second data quantity determining operation.

Particularly, the memory control circuit unit 104 (or the memory management circuit 202) updates the first threshold by using the first threshold plus the first accumulated value at intervals of the predetermined time (e.g., 1 ms). Therefore, in order to control the first threshold to maintain within a specific range when the temperature of the memory storage apparatus 100 exceeds the temperature threshold, the memory control circuit unit 104 (or the memory management circuit 202) may calculate a maximum data quantity value before updating the first threshold, and detect the temperature of the memory storage apparatus 100 and determine whether the temperature of the memory storage apparatus 100 is greater than or equal to the temperature threshold after obtaining an update value of the first threshold by using the first threshold plus the first accumulated value. If the temperature of the memory storage apparatus 100 is not greater than or equal to the temperature threshold, the memory control circuit unit 104 (or the memory management circuit 202) updates the first threshold by using the update value. Particularly, if the temperature of the memory storage apparatus 100 is greater than or equal to the temperature threshold, the memory control circuit unit 104 (or the memory management circuit 202) determines whether update value is greater than or equal to the maximum data quantity value being calculated. If the update value is not greater than or equal to the maximum data quantity value, the memory control circuit unit 104 (or the memory management circuit 202) updates the first threshold by using the update value. Otherwise, the first threshold is updated by using the maximum data quantity value. Herein, the maximum data quantity value is a system default value, but the invention is not limited thereto. The maximum data quantity value may also be adjusted and set according to the execution performance of the rewritable non-volatile memory module 106.

Figure 4:
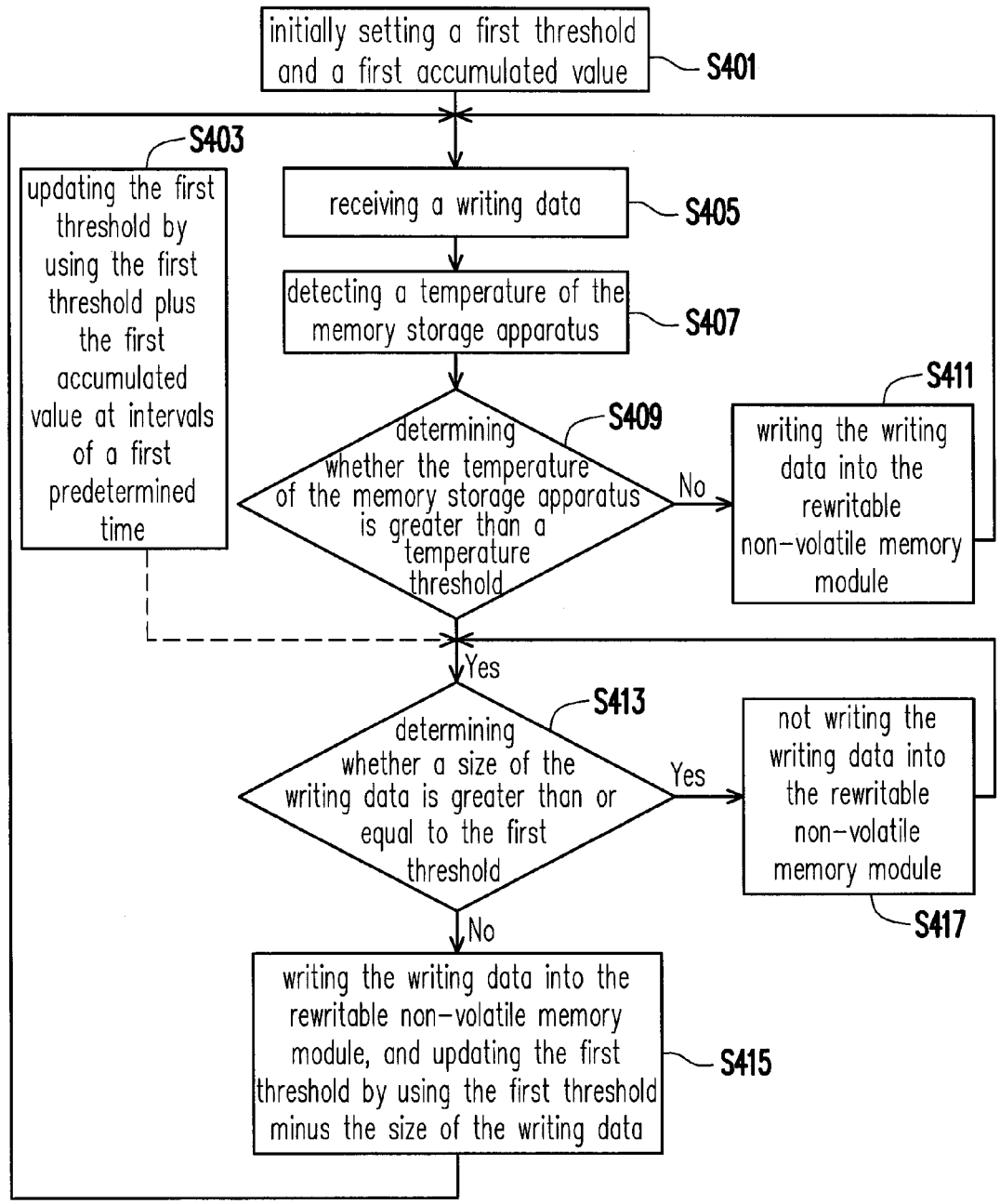
FIG. 4 is a flowchart illustrating a transmitting method of the writing data according to first exemplary embodiment of the present invention.

FIG. 4 is a flowchart illustrating a transmitting method of the writing data according to first exemplary embodiment of the invention.

Referring to FIG. 4, in step S401, the memory control circuit unit 104 (or the memory management circuit 202) initially sets a first threshold and a first accumulated value. And, in step S403, the memory control circuit unit 104 (or the memory management circuit 202) updates the first threshold by using the first threshold plus the first accumulated value at intervals of a first predetermined time (e.g., 1 ms).

In step S405, the memory control circuit unit 104 (or the memory management circuit 202) receives a data to be written into the rewritable non-volatile memory module 106 that is transmitted from the host system 1000. And, in step S407, the memory control circuit unit 104 (or the memory management circuit 202) detects a temperature of the memory storage apparatus 100.

In step S409, the memory control circuit unit 104 (or the memory management circuit 202) determines whether the detected temperature of the memory storage apparatus 100 is greater than or equal to the temperature threshold. If the temperature of the memory storage apparatus 100 is not greater than or equal to the temperature threshold, in step S411, the memory control circuit unit 104 (or the memory management circuit 202) executes a common data writing operation, so as to write a received writing data into the rewritable non-volatile memory module 106. On the contrary, if the temperature of the memory storage apparatus 100 is greater than or equal to the temperature threshold, in step S413, the memory control circuit unit 104 (or the memory management circuit 202) executes a data quantity determining operation.

In step S413, the memory control circuit unit 104 (or the memory management circuit 202) determines whether a size of the writing data is greater than or equal to the first threshold. If the size of the writing data is not greater than or equal to the first threshold, in step S415, the memory control circuit unit 104 (or the memory management circuit 202) executes the data writing operation to write the writing data into the rewritable non-volatile memory module 106 and update the first threshold by using the first threshold minus the size of the writing data. On the contrary, if the size of the writing data is greater than or equal to the first threshold, in step S417, the memory control circuit unit 104 (or the memory management circuit 202) executes a pause writing operation to not write the writing data into the rewritable non-volatile memory module 106 and re-execute step S413 after a first predetermined time (e.g., 1 ms).

Particularly, in step S403, because the memory control circuit unit 104 (or the memory management circuit 202) updates the first threshold by using the first threshold plus the first accumulated value at intervals of the first predetermined time (e.g., 1 ms), the first threshold may be constantly changed. In other words, during the pause writing operation executed in step S417, step S415 may only be executed after the first threshold is updated to be equivalent to the size of the writing data (i.e., the size of the writing data is not greater than or equal to the first threshold), so as to control a data writing speed for reducing power consumption.

Figure 5:
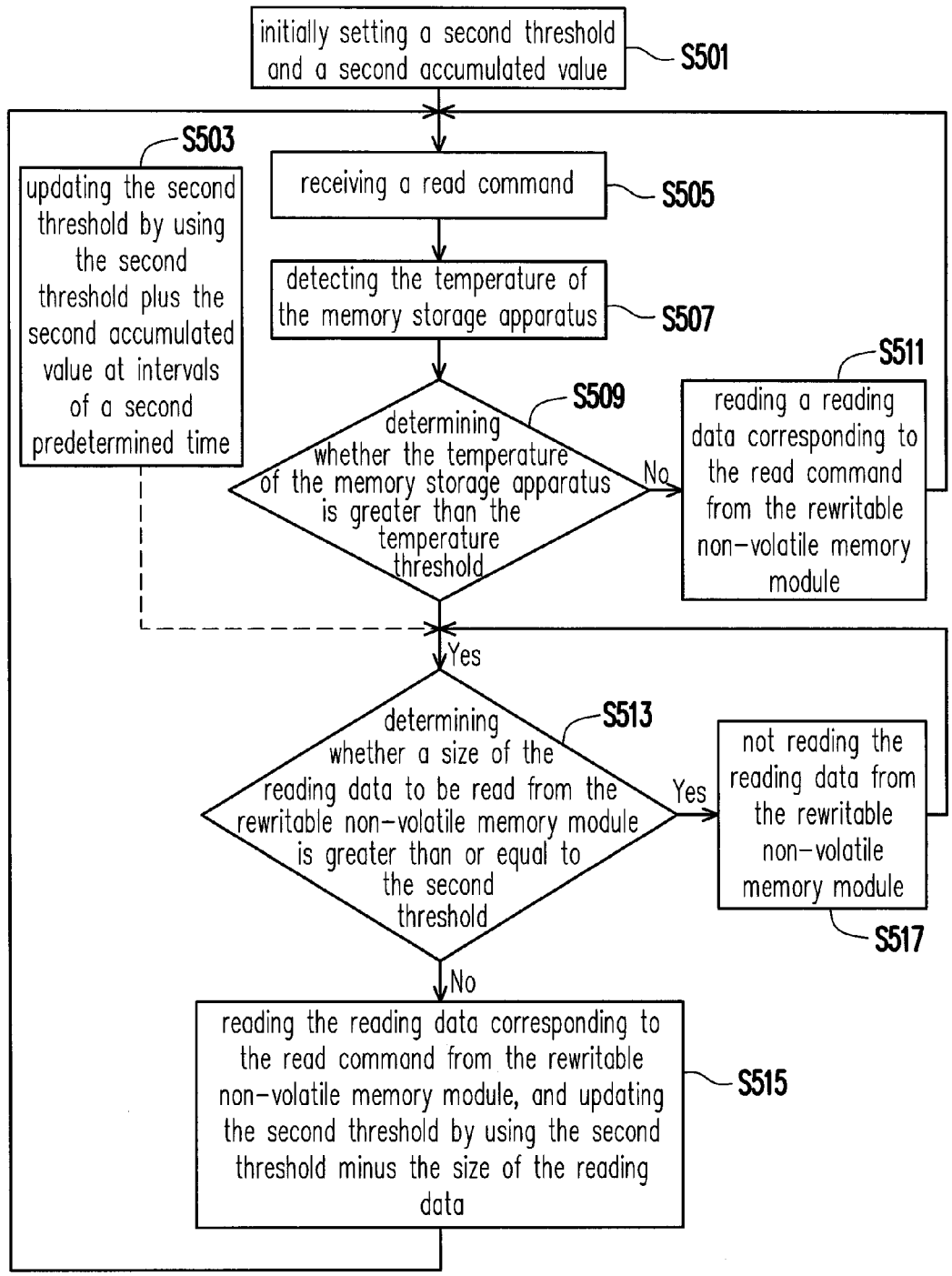
FIG. 5 is a flowchart illustrating a transmitting method of the reading data according to first exemplary embodiment of the present invention.

FIG. 5 is a flowchart illustrating a transmitting method of the reading data according to first exemplary embodiment of the invention.

Referring to FIG. 5, first, in step S501, the memory control circuit unit 104 (or the memory management circuit 202) initially sets a second threshold and a second accumulated value. And, in step S503, the memory control circuit unit 104 (or the memory management circuit 202) updates the second threshold by using the second threshold plus the second accumulated value at intervals of a second predetermined time (e.g., 1 ms).

After the memory control circuit unit 104 (or the memory management circuit 202) receives a read command from the host system 1000 that is intended to read the data from the rewritable non-volatile memory module 106 in step S505, the temperature of the memory storage apparatus 100 is detected in step S507.

In step S509, the memory control circuit unit 104 (or the memory management circuit 202) determines whether the detected temperature of the memory storage apparatus 100 is greater than or equal to the temperature threshold. If the temperature of the memory storage apparatus 100 is not greater than or equal to the temperature threshold, in step S511, the memory control circuit unit 104 (or the memory management circuit 202) executes a common data reading operation, so as to read a reading data corresponding to the read command from the rewritable non-volatile memory module 106. On the contrary, if the temperature of the memory storage apparatus 100 is greater than or equal to the temperature threshold, in step S513, the memory control circuit unit 104 (or the memory management circuit 202) executes a data quantity determining operation.

In step S513, the memory control circuit unit 104 (or the memory management circuit 202) determines whether the size of the reading data to be read from the rewritable non-volatile memory module 106 is greater than or equal to the second threshold. If the size of the reading data is not greater than or equal to the second threshold, in step S515, the memory control circuit unit 104 (or the memory management circuit 202) executes the data reading operation to read the data to be read from the rewritable non-volatile memory module 106 and update the second threshold by using the second threshold minus the size of the reading data. On the contrary, if the size of the reading data is greater than or equal to the second threshold, in step S517, the memory control circuit unit 104 (or the memory management circuit 202) executes a pause reading operation to not read the reading data from the rewritable non-volatile memory module 106 and re-execute step S513 after a second predetermined time (e.g., 1 ms).

Particularly, in step S503, because the memory control circuit unit 104 (or the memory management circuit 202) updates the second threshold by using the second threshold plus the second accumulated value at intervals of the second predetermined time (e.g., 1 ms), the second threshold may be constantly changed. In other words, during the pause reading operation executed in step S517, step S515 may only be executed after the second threshold is updated to be equivalent to the size of the reading data (i.e., the size of the reading data is not greater than or equal to the second threshold, so as to control a data reading speed for reducing power consumption.

Figure 6:
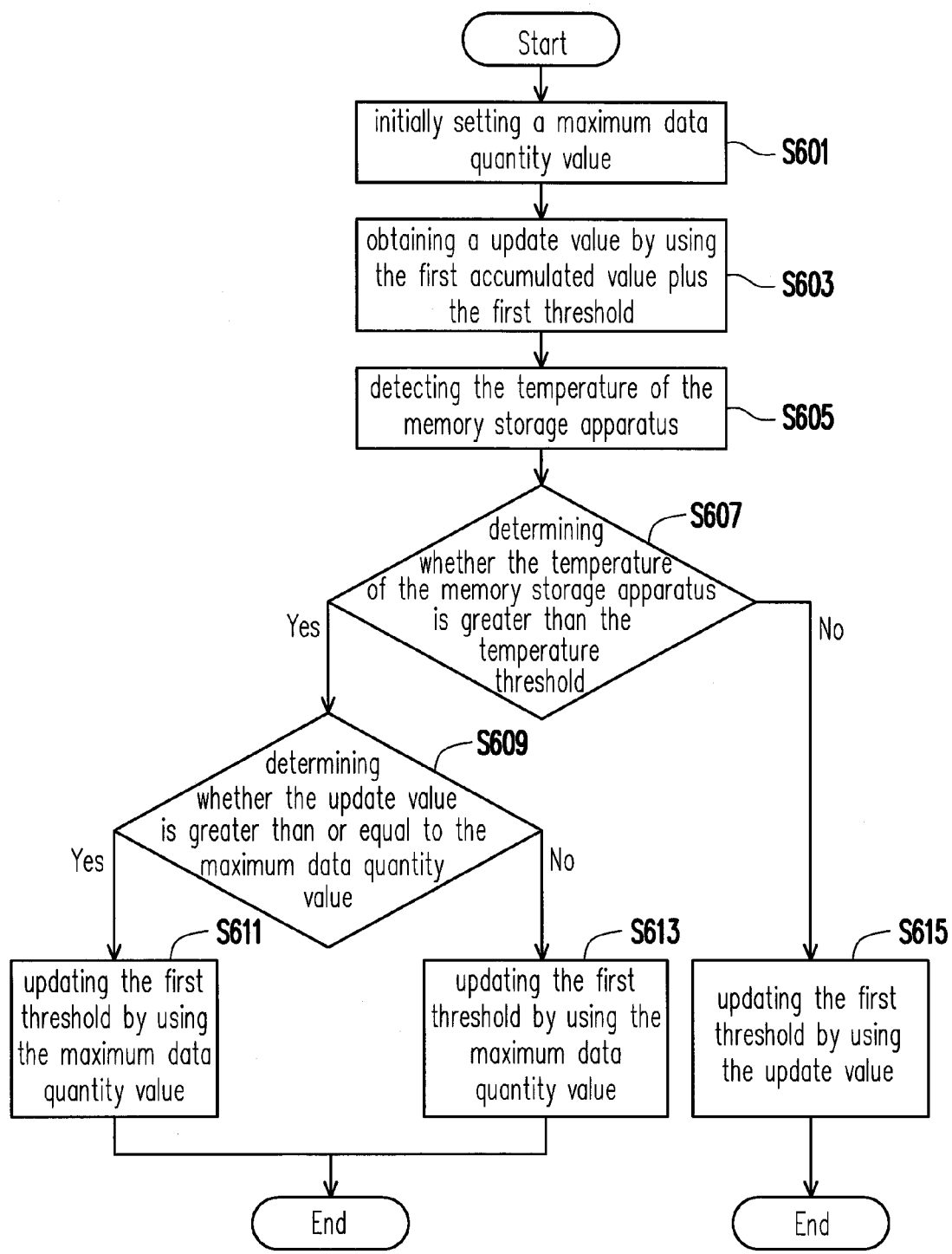
FIG. 6 is a flowchart illustrating steps of updating the threshold according to first exemplary embodiment of the present invention.

FIG. 6 is a flowchart illustrating steps of updating the threshold according to first exemplary embodiment of the present invention.

Referring to FIG. 6, in step S601, the memory control circuit unit 104 (or the memory management circuit 202) initially sets a maximum data quantity value. The maximum data quantity value is a system default value, but the present invention is not limited thereto. The maximum data quantity value may also be adjusted and set according to the execution performance of the rewritable non-volatile memory module 106.

The memory control circuit unit 104 (or the memory management circuit 202) in the present exemplary embodiment constantly updates a first threshold by using the first threshold plus a first accumulated value at intervals of a predetermined time. Accordingly, in step S603, the memory control circuit unit 104 (or the memory management circuit 202) obtains an update value by using the first threshold plus the first accumulated value.

Next, the memory control circuit unit 104 (or the memory management circuit 202) is further configured to detect the temperature of the memory storage apparatus 100 in step S605, and determine whether the temperature of the memory storage apparatus 100 is greater than or equal to the temperature threshold in step S607. Particularly, the memory control circuit unit 104 (or the memory management circuit 202) executes steps S609 to S613 for limiting the first threshold only if the temperature of the memory storage apparatus 100 is greater than or equal to the temperature threshold. In step S609, the memory control circuit unit 104 (or the memory management circuit 202) determines whether the update value is greater than or equal to the maximum data quantity value. If the update value is greater than or equal to the maximum data quantity value, in step S611, the memory control circuit unit 104 (or the memory management circuit 202) updates the first threshold by using the maximum data quantity value. Otherwise, in step S613, the memory control circuit unit 104 (or the memory management circuit 202) updates the first threshold by using the update value. Accordingly, in case the temperature of the memory storage apparatus 100 is increased to reach the temperature threshold, the memory control circuit unit 104 (or the memory management circuit 202) may control the first threshold to maintain within a specific range. It should be noted that, if the temperature of the memory storage apparatus 100 is not greater than or equal to the temperature threshold, the memory control circuit unit 104 (or the memory management circuit 202) updates the first threshold by using the update value (step S615) without limiting the first threshold by the maximum data quantity value. In other words, when the temperature of the memory storage apparatus 100 is not greater than or equal to the temperature threshold, the first threshold may be greater than or equal to the maximum data quantity value.

Second Exemplary Embodiment

A memory storage apparatus and a host system in second exemplary embodiment are essentially similar to the memory storage apparatus and the host system in first exemplary embodiment, and a difference between the two is that, the first accumulated value of second exemplary embodiment may be adjust according to changes in the temperature of the memory storage apparatus. The difference between first exemplary embodiment and second exemplary embodiment are described below by reference with device structures depicted in FIG. 1A, FIG. 2 and FIG. 3.

In the present exemplary embodiment, in the operation of setting the first accumulated value, the memory control circuit unit 104 (or the memory management circuit 202) detects the temperature of the memory storage apparatus 100 and determines whether the temperature of the memory storage apparatus 100 is greater than or equal to the temperature threshold. If the temperature of the memory storage apparatus 100 is not greater than or equal to the temperature threshold, the memory control circuit unit 104 (or the memory management circuit 202) sets the first accumulated value by using a first value. On the contrary, if the temperature of the memory storage apparatus 100 is greater than or equal to the temperature threshold, the first accumulated value is set by using a second value, wherein the first value is greater than or equal to the second value. More specifically, because the temperature of the memory storage apparatus 100 does not reach the temperature threshold, the memory control circuit unit 104 (or the memory management circuit 202) will not execute the data transmitting method for limiting the data transmission speed as described in first exemplary embodiment. Accordingly, the first value being relatively greater may be used to set the first accumulated value, so as to improve the data transmission speed and improve access performance of the memory storage apparatus 100 during operation.

Figure 7:
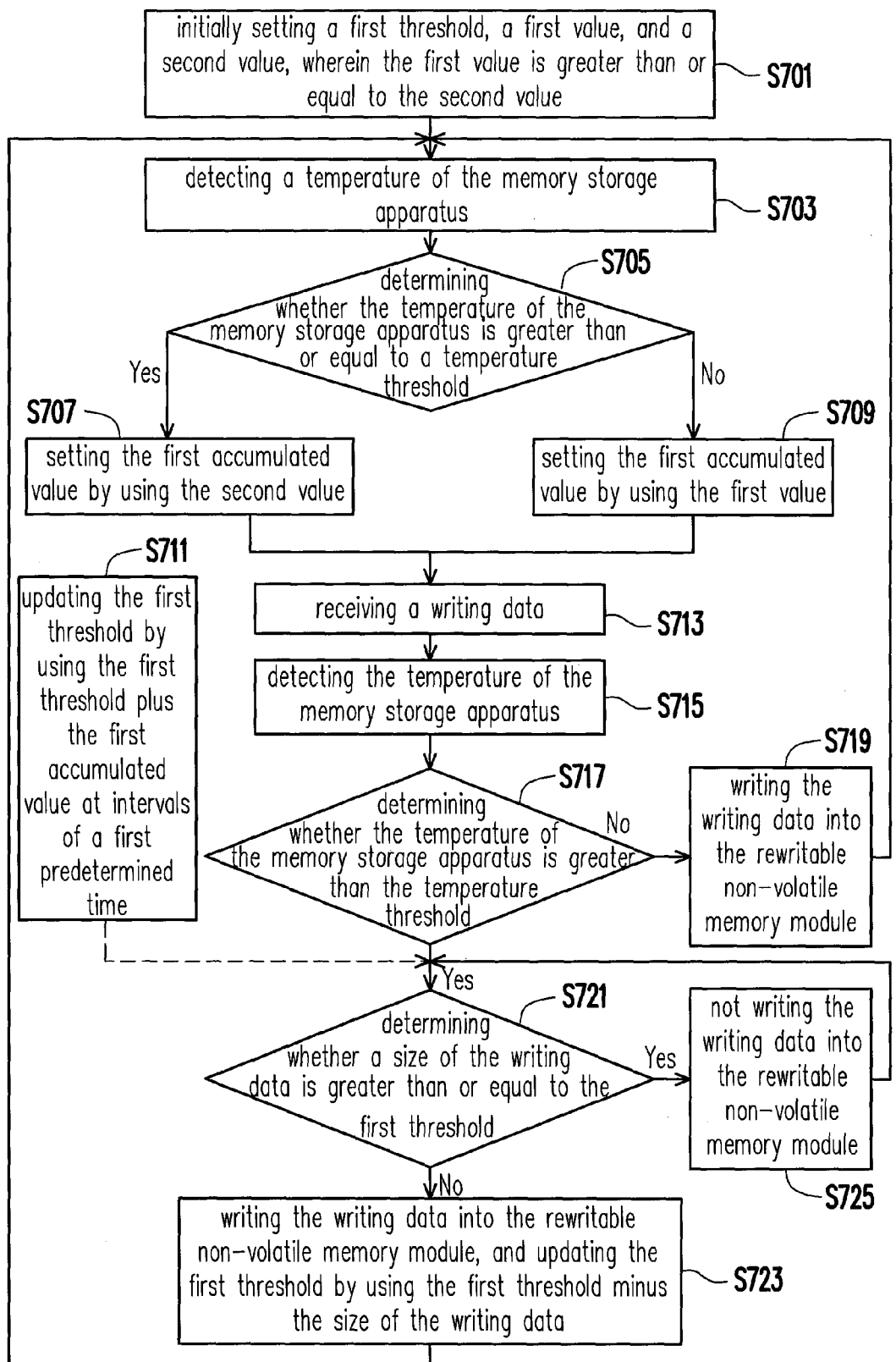
FIG. 7 is a flowchart illustrating the transmitting method of the writing data for dynamically updating the accumulated value according to second exemplary embodiment of the present invention.

FIG. 7 is a flowchart illustrating the transmitting method of the writing data for dynamically updating the accumulated value according to second exemplary embodiment of the present invention.

Referring to FIG. 7, in step S701, the memory control circuit unit 104 (or the memory management circuit 202) initially sets a first threshold, a first value, and a second value. Therein, the first value is set to a value greater than or equal to the second value.

The memory control circuit unit 104 (or the memory management circuit 202) detects the temperature of the memory storage apparatus 100 in step S703, and determines whether the detected temperature of the memory storage apparatus 100 is greater than or equal to the temperature threshold in step S705. If the temperature of the memory storage apparatus 100 is greater than or equal to the temperature threshold, in step S707, the memory control circuit unit 104 (or the memory management circuit 202) sets the first accumulated value by using the second value being relatively smaller. On the contrary, if the temperature of the memory storage apparatus 100 is not greater than or equal to the temperature threshold, in step S709, the memory control circuit unit 104 (or the memory management circuit 202) sets the first accumulated value by using the first value being relatively greater.

Thereafter, step S711 to step S725 are identical to step S403 to step S417 of the transmitting method of the writing data in FIG. 4 of first exemplary embodiment respectively, thus related descriptions are omitted hereinafter. Particularly, the flow returns back to step S703 after step S719 and step S723 are executed, so as to execute steps S703 to S709 for dynamically setting the first accumulated value.

Figure 8:
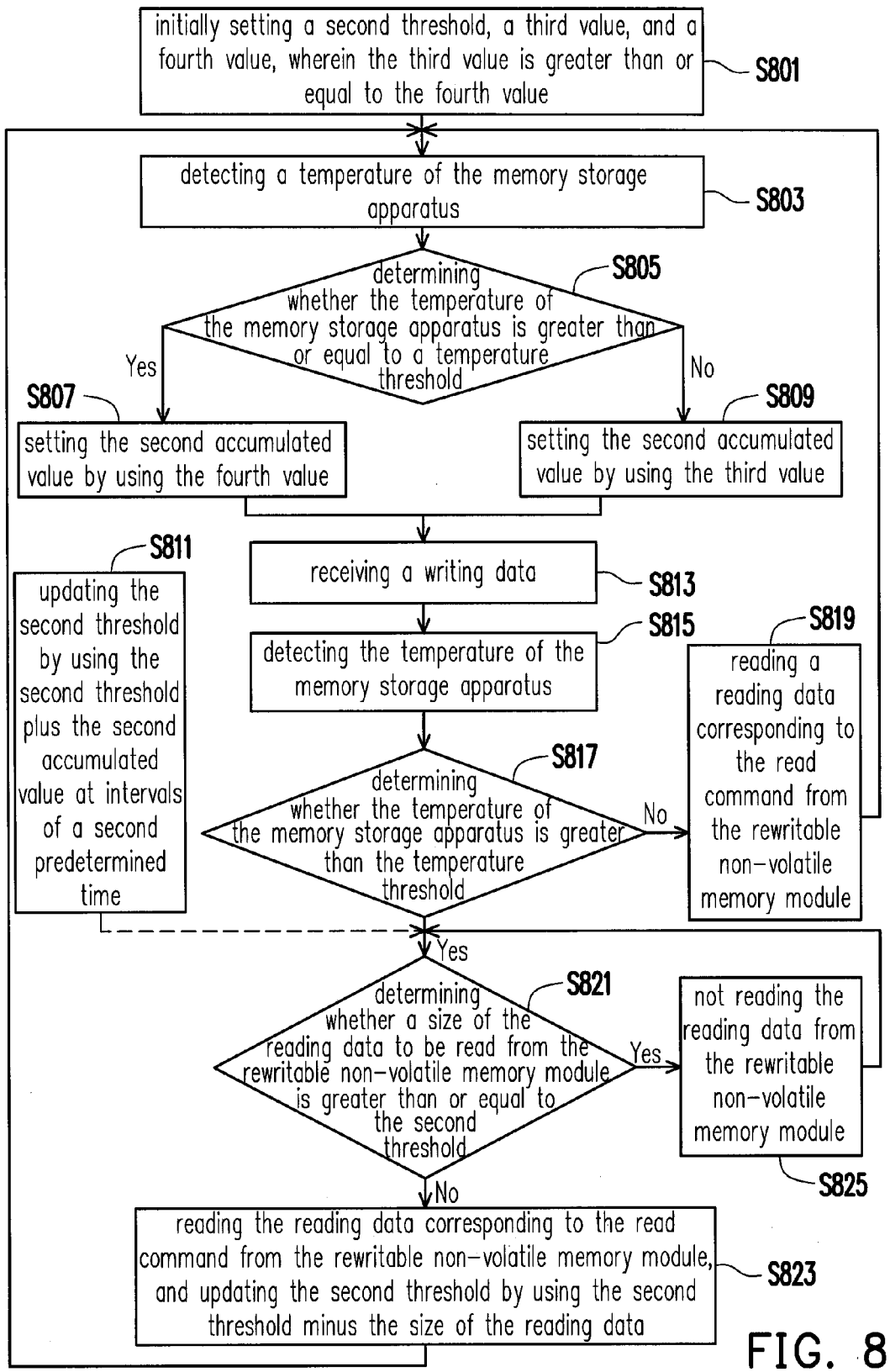
FIG. 8 is a flowchart illustrating the transmitting method of the reading data for dynamically updating the accumulated value according to second exemplary embodiment of the present invention.

FIG. 8 is a flowchart illustrating the transmitting method of the reading data for dynamically updating the accumulated value according to second exemplary embodiment of the present invention.

Referring to FIG. 8, in step S801, the memory control circuit unit 104 (or the memory management circuit 202) initially sets a second threshold, a third value, and a fourth value. Therein, the third value is set to a value greater than or equal to the fourth value.

The memory control circuit unit 104 (or the memory management circuit 202) detects the temperature of the memory storage apparatus 100 in step S803, and determines whether the detected temperature of the memory storage apparatus 100 is greater than or equal to the temperature threshold in step S805. If the temperature of the memory storage apparatus 100 is greater than or equal to the temperature threshold, in step S807, the memory control circuit unit 104 (or the memory management circuit 202) sets the second accumulated value by using the fourth value being relatively smaller. On the contrary, if the temperature of the memory storage apparatus 100 is not greater than or equal to the temperature threshold, in step S809, the memory control circuit unit 104 (or the memory management circuit 202) sets the second accumulated value by using the third value being relatively greater.

Next, step S811 to step S825 are identical to step S503 to step S517 of the transmitting method of the reading data in FIG. 5 of first exemplary embodiment respectively, thus related descriptions are omitted hereinafter. Particularly, the flow returns back to step S803 after step S819 and step S823 are executed, so as to execute steps S803 to S809 for adjusting the second accumulated value.

In summary, according to the data transmitting method, the memory control circuit unit and the memory storage apparatus, when the temperature of the memory storage apparatus reaches the threshold, the data transmission speed may be limited by controlling the threshold, such that power consumption may be reduced to prevent overheat of system during operation of the memory storage apparatus for rapidly accessing great amount of data. In addition, according to the data transmitting method, the memory control circuit unit and the memory storage apparatus, the accumulated value may further be dynamically set according to the temperature of the memory storage apparatus, so as to improve data transmission speed and data access performance while in considering the balance between heat generation and heat dissipation for the memory storage apparatus.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data transmitting method for a memory storage apparatus having a rewritable non-volatile memory module, and the data transmitting method comprising:
    (a) initially setting a first threshold and a first accumulated value;
    (b) updating the first threshold by using the first threshold plus the first accumulated value at intervals of a first predetermined time;
    (c) receiving a writing data;
    (d) detecting a temperature of the memory storage apparatus;
    (e) determining whether the temperature of the memory storage apparatus is greater than or equal to a temperature threshold, wherein step (f) is executed if the temperature of the memory storage apparatus is not greater than or equal to the temperature threshold, and step (g) is executed if the temperature of the memory storage apparatus is greater than or equal to the temperature threshold;
    (f) writing the writing data into the rewritable non-volatile memory module;
    (g) determining whether a size of the writing data is greater than or equal to the first threshold, wherein step (h) is executed if the size of the writing data is not greater than or equal to the first threshold, and step (i) is executed if the size of the writing data is greater than or equal to the first threshold;
    (h) writing the writing data into the rewritable non-volatile memory module, and updating the first threshold by using the first threshold minus the size of the writing data; and
    (i) not writing the writing data into the rewritable non-volatile memory module, and re-executing the step (g) after the first predetermined time.

2. The data transmitting method of claim 1, wherein the step of setting the first accumulated value comprises:
    setting the first accumulated value by using a first value if the temperature of the memory storage apparatus is not greater than or equal to the temperature threshold; and
    setting the first accumulated value by using a second value if the temperature of the memory storage apparatus is greater than or equal to the temperature threshold,
    wherein the first value is greater than the second value.

3. The data transmitting method of claim 1, wherein the step of updating the first threshold by using the first threshold plus the first accumulated value at intervals of the first predetermined time comprises:
    initially setting a maximum data quantity value;
    obtaining an update value by using the first accumulated value plus the first threshold;
    updating the first threshold by using the update value if the temperature of the memory storage apparatus is not greater than or equal to the temperature threshold;
    determining whether the update value is greater than or equal to the maximum data quantity value if the temperature of the memory storage apparatus is greater than or equal to the temperature threshold;
    updating the first threshold by using the update value if the update value is not greater than or equal to the maximum data quantity value; and
    updating the first threshold by using the maximum data quantity value if the update value is greater than or equal to the maximum data quantity value.

4. The data transmitting method of claim 3, wherein the first threshold is greater than or equal to the maximum data quantity value if the temperature of the memory storage apparatus is not greater than or equal to the temperature threshold.

5. The data transmitting method of claim 1, further comprising:
    (j) initially setting a second threshold and a second accumulated value;
    (k) updating the second threshold by using the second threshold plus the second accumulated value at intervals of a second predetermined time;
    (l) receiving a read command;
    (m) detecting the temperature of the memory storage apparatus;
    (e) determining whether the temperature of the memory storage apparatus is greater than or equal to the temperature threshold, wherein step (o) is executed if the temperature is not greater than or equal to the temperature threshold, and step (p) is executed if the temperature is greater than or equal to the temperature threshold;
    (o) reading a reading data corresponding to the read command from the rewritable non-volatile memory module; and
    (p) determining whether a size of the reading data to be read from the rewritable non-volatile memory module is greater than or equal to the second threshold, wherein step (q) is executed if the size of the reading data is not greater than or equal to the second threshold, and step (r) is executed if the size of the reading data is greater than or equal to the second threshold;

(q) reading the reading data corresponding to the read command from the rewritable non-volatile memory module, and updating the second threshold by using the second threshold minus the size of the reading data; and (r) not reading the reading data from the rewritable non-volatile memory module, and re-executing the step (p) after the second predetermined time.

6. The data transmitting method of claim 5, wherein the step of setting the second accumulated value comprises:

setting the second accumulated value by using a third value if the temperature of the memory storage apparatus is not greater than or equal to the temperature threshold; and setting the second accumulated value by using a fourth value if the temperature of the memory storage apparatus is greater than or equal to the temperature threshold, wherein the third value is greater than the fourth value.

7. A memory control circuit unit for controlling a rewritable non-volatile memory module of a memory storage apparatus, and the memory control circuit unit comprises:

a host interface configured to couple to a host system;

a memory interface configured to couple to the rewritable non-volatile memory module; and a memory management circuit coupled to the host interface and the memory interface, wherein the memory management circuit initially sets a first threshold and a first accumulated value, and updates the first threshold by using the first threshold plus the first accumulated value at intervals of a first predetermined time, wherein the memory management circuit is further configured to receive a writing data, wherein the memory management circuit is further configured to detect a temperature of the memory storage apparatus and determine whether the temperature of the memory storage apparatus is greater than or equal to a temperature threshold, wherein if the temperature of the memory storage apparatus is not greater than or equal to the temperature threshold, the memory management circuit is configured to send a first command sequence, and the first command sequence is configured to instruct for executing a data writing operation to write the writing data into the rewritable non-volatile memory module, wherein if the temperature of the memory storage apparatus is greater than or equal to the temperature threshold, the memory management circuit is further configured to execute a first data quantity determining operation to determine whether a size of the writing data is greater than or equal to the first threshold, wherein if the size of the writing data is not greater than or equal to the first threshold, the memory management circuit sends the first command sequence, and the first command sequence is configured to instruct for executing the data writing operation to write the writing data into the rewritable non-volatile memory module and the memory management circuit updates the first threshold by using the first threshold minus the size of the writing data, wherein if the size of the writing data is greater than or equal to the first threshold, the memory management circuit executes a pause writing operation to not write the writing data into the rewritable non-volatile memory module and re-execute the first data quantity determining operation after the first predetermined time.

8. The memory control circuit unit of claim 7, wherein if the temperature of the memory storage apparatus is not greater than or equal to the temperature threshold, the memory management circuit sets the first accumulated value by using a first value, wherein if the temperature of the memory storage apparatus is greater than or equal to the temperature threshold, the memory management circuit sets the first accumulated value by using a second value, wherein the first value is greater than the second value.

9. The memory control circuit unit of claim 8, wherein in the operation of updating the first threshold by using the first threshold plus the first accumulated value at intervals of the first predetermined time, the memory management circuit is further configured to initially set a maximum data quantity value and obtain an update value by using the first accumulated value plus the first threshold, wherein if the temperature of the memory storage apparatus is not greater than or equal to the temperature threshold, the memory management circuit updates the first threshold by using the update value, wherein if the temperature of the memory storage apparatus is greater than or equal to the temperature threshold, the memory management circuit is further configured to determine whether the update value is greater than or equal to the maximum data quantity value, wherein if the update value is not greater than or equal to the maximum data quantity value, the memory management circuit updates the first threshold by using the update value, wherein if the update value is greater than or equal to the maximum data quantity value, the memory management circuit updates the first threshold by using the maximum data quantity value.

10. The memory control circuit unit of claim 9, wherein the first threshold is greater than or equal to the maximum data quantity value if the temperature of the memory storage apparatus is not greater than or equal to the temperature threshold.

11. The memory control circuit unit of claim 7, wherein the memory management circuit is further configured to initially set a second threshold and a second accumulated value, and update the second threshold by using the second threshold plus the second accumulated value at intervals of a second predetermined time, wherein the memory management circuit is further configured to receive a read command from the host system, wherein the memory management circuit is further configured to detect the temperature of the memory storage apparatus and determine whether the temperature of the memory storage apparatus is greater than or equal to the temperature threshold, wherein if the temperature of the memory storage apparatus is not greater than or equal to the temperature threshold, the memory management circuit is configured to send a second command sequence, and the second command sequence is configured to instruct for executing a data reading operation to read a reading data corresponding to the read command from the rewritable non-volatile memory module, wherein if the temperature of the memory storage apparatus is greater than or equal to the temperature threshold, the memory management circuit is further configured to execute a second data quantity determining operation to determine whether a size of the reading data to be read from the rewritable non-volatile memory module is greater than or equal to the second threshold, wherein if the size of the reading data is not greater than or equal to the second threshold, the memory management circuit sends the second command sequence, and the second command sequence is configured to instruct for executing the data reading operation to read the reading data corresponding to the read command from the rewritable non-volatile memory module and the memory management circuit updates the second threshold by using the second threshold minus the size of the reading data, wherein if the size of the reading data is greater than or equal to the second threshold, the memory management circuit executes a pause reading operation to not read the reading data from the rewritable non-volatile memory module and re-execute the second data quantity determining operation after the second predetermined time.

12. The memory control circuit unit of claim 11, wherein if the temperature of the memory storage apparatus is not greater than or equal to the temperature threshold, the memory management circuit sets the second accumulated value by using a third value, wherein if the temperature of the memory storage apparatus is greater than or equal to the temperature threshold, the memory management circuit sets the second accumulated value by using a fourth value, wherein the third value is greater than the fourth value.

13. A memory storage apparatus, comprising:

a connection interface unit configured to couple to a host system;

a rewritable non-volatile memory module; and a memory control circuit unit coupled to the connection interface unit and the rewritable non-volatile memory module, wherein the memory control circuit unit initially sets a first threshold and a first accumulated value, and updates the first threshold by using the first threshold plus the first accumulated value at intervals of a first predetermined time, wherein the memory control circuit unit is further configured to receive a writing data, wherein the memory control circuit unit is further configured to detect a temperature of the memory storage apparatus and determine whether the temperature of the memory storage apparatus is greater than or equal to a temperature threshold, wherein if the temperature of the memory storage apparatus is not greater than or equal to the temperature threshold, the memory control circuit unit is configured to send a first command sequence, and the first command sequence is configured to instruct for executing a data writing operation to write the writing data into the rewritable non-volatile memory module, wherein if the temperature of the memory storage apparatus is greater than or equal to the temperature threshold, the memory control circuit unit is further configured to execute a first data quantity determining operation to determine whether a size of the writing data is greater than or equal to the first threshold, wherein if the size of the writing data is not greater than or equal to the first threshold, the memory control circuit unit sends the first command sequence, and the first command sequence is configured to instruct for executing the data writing operation to write the writing data into the rewritable non-volatile memory module and the memory control circuit unit updates the first threshold by using the first threshold minus the size of the writing data, wherein if the size of the writing data is greater than or equal to the first threshold, the memory control circuit unit executes a pause writing operation to not write the writing data into the rewritable non-volatile memory module and re-execute the first data quantity determining operation after the first predetermined time.

14. The memory storage apparatus of claim 13, wherein if the temperature of the memory storage apparatus is not greater than or equal to the temperature threshold, the memory control circuit unit sets the first accumulated value by using a first value, wherein if the temperature of the memory storage apparatus is greater than or equal to the temperature threshold, the memory control circuit unit sets the first accumulated value by using a second value, wherein the first value is greater than the second value.

15. The memory storage apparatus of claim 14, wherein in the operation of updating the first threshold by using the first threshold plus the first accumulated value at intervals of the first predetermined time, the memory control circuit unit is further configured to initially set a maximum data quantity value and obtain an update value by using the first accumulated value plus the first threshold, wherein if the temperature of the memory storage apparatus is not greater than or equal to the temperature threshold, the memory control circuit unit updates the first threshold by using the update value, wherein if the temperature of the memory storage apparatus is greater than or equal to the temperature threshold, the memory control circuit unit is further configured to determine whether the update value is greater than or equal to the maximum data quantity value, wherein if the update value is not greater than or equal to the maximum data quantity value, the memory control circuit unit updates the first threshold by using the update value, wherein if the update value is greater than or equal to the maximum data quantity value, the memory control circuit unit updates the first threshold by using the maximum data quantity value.

16. The memory storage apparatus of claim 15, wherein the first threshold is greater than or equal to the maximum data quantity value if the temperature of the memory storage apparatus is not greater than or equal to the temperature threshold.

17. The memory storage apparatus of claim 13, wherein the memory control circuit unit is further configured to initially set a second threshold and a second accumulated value, and update the second threshold by using the second threshold plus the second accumulated value at intervals of a second predetermined time, wherein the memory control circuit unit is further configured to receive a read command from the host system, wherein the memory control circuit unit is further configured to detect the temperature of the memory storage apparatus and determine whether the temperature of the memory storage apparatus is greater than or equal to the temperature threshold, wherein if the temperature of the memory storage apparatus is not greater than or equal to the temperature threshold, the memory control circuit unit is configured to send a second command sequence, and the second command sequence is configured to instruct for executing a data reading operation to read a reading data corresponding to the read command from the rewritable non-volatile memory module, wherein if the temperature of the memory storage apparatus is greater than or equal to the temperature threshold, the memory control circuit unit is further configured to execute a second data quantity determining operation to determine whether a size of the reading data to be read from the rewritable non-volatile memory module is greater than or equal to the second threshold, wherein if the size of the reading data is not greater than or equal to the second threshold, the memory control circuit unit sends the second command sequence, and the second command sequence is configured to instruct for executing the data reading operation to read the reading data corresponding to the read command from the rewritable non-volatile memory module and the memory control circuit unit updates the second threshold by using the second threshold minus the size of the reading data, wherein if the size of the reading data is greater than or equal to the second threshold, the memory control circuit unit executes a pause reading operation to not read the reading data from the rewritable non-volatile memory module and re-execute the second data quantity determining operation after the second predetermined time.

18. The memory storage apparatus of claim 17, wherein if the temperature of the memory storage apparatus is not greater than or equal to the temperature threshold, the memory control circuit unit sets the second accumulated value by using a third value, wherein if the temperature of the memory storage apparatus is greater than or equal to the temperature threshold, the memory control circuit unit sets the second accumulated value by using a fourth value, wherein the third value is greater than the fourth value.

* * * * *